United States Patent
Raukopf et al.

(10) Patent No.: US 10,438,871 B2
(45) Date of Patent: Oct. 8, 2019

(54) ELECTRIC CONDUCTOR TRACK, METHOD, AND USE

(71) Applicant: Continental Teves AG & Co. oHG, Frankfurt (DE)

(72) Inventors: Svenja Raukopf, Gemünden Felda-Hainbach (DE); Lothar Biebricher, Oberursel (DE); Dietmar Huber, Rödermark (DE); Jakob Schillinger, Gaimersheim (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 0 days.

(21) Appl. No.: 15/773,633

(22) PCT Filed: Sep. 29, 2016

(86) PCT No.: PCT/EP2016/073162
§ 371 (c)(1),
(2) Date: May 4, 2018

(87) PCT Pub. No.: WO2017/092907
PCT Pub. Date: Jun. 8, 2017

(65) Prior Publication Data
US 2018/0323134 A1    Nov. 8, 2018

(30) Foreign Application Priority Data
Dec. 3, 2015 (DE) .......... 10 2015 224 257

(51) Int. Cl.
*H01L 21/00* (2006.01)
*H01L 23/00* (2006.01)
(Continued)

(52) U.S. Cl.
CPC ...... *H01L 23/49565* (2013.01); *B23K 20/004* (2013.01); *B23K 20/10* (2013.01);
(Continued)

(58) Field of Classification Search
CPC ...... B23K 20/004; B23K 20/10; B23K 20/24; B23K 20/12; B23K 2101/32;
(Continued)

(56) References Cited

U.S. PATENT DOCUMENTS 7,884,287 B2   2/2011   Göbl et al.
9,228,860 B2   1/2016   Sharma et al.
(Continued)

FOREIGN PATENT DOCUMENTS

CN   101467058 A   6/2009
CN   104641510 A   5/2015
(Continued)

OTHER PUBLICATIONS

English translation of the Written Opinion for International Application No. PCT/EP2016/073162, dated Jan. 17, 2017, 7 pages.
(Continued)

*Primary Examiner* — Nikolay K Yushin
(74) *Attorney, Agent, or Firm* — RatnerPrestia

(57) ABSTRACT

A conductor track which is designed in particular for use with ultrasonic welding. The invention also relates to an associated method and to an associated use.

13 Claims, 3 Drawing Sheets

(51) Int. Cl.
*H01L 23/495* (2006.01)
*B23K 20/10* (2006.01)
*H01R 4/02* (2006.01)
*H01R 43/02* (2006.01)
*B23K 20/00* (2006.01)
*H01L 21/48* (2006.01)
*B23K 101/32* (2006.01)
*B23K 101/38* (2006.01)
*B23K 101/42* (2006.01)

(52) U.S. Cl.
CPC ...... *H01L 21/4825* (2013.01); *H01L 23/4952* (2013.01); *H01L 23/49541* (2013.01); *H01L 23/49562* (2013.01); *H01L 24/48* (2013.01); *H01L 24/80* (2013.01); *H01L 24/85* (2013.01); *H01R 4/029* (2013.01); *H01R 43/0207* (2013.01); *B23K 2101/32* (2018.08); *B23K 2101/38* (2018.08); *B23K 2101/42* (2018.08); *H01L 24/49* (2013.01); *H01L 2224/05554* (2013.01); *H01L 2224/48108* (2013.01); *H01L 2224/48245* (2013.01); *H01L 2224/48247* (2013.01); *H01L 2224/49171* (2013.01); *H01L 2224/85205* (2013.01); *H01L 2224/85206* (2013.01); *H01L 2924/00014* (2013.01)

(58) Field of Classification Search
CPC ............ B23K 2101/42; B23K 2101/38; H01L 21/4825; H01L 21/4565; H01L 21/78; H01L 21/485; H01L 23/49565; H01L 23/4952; H01L 23/49541; H01L 23/49562; H01L 24/48; H01L 24/80; H01L 24/85; H01L 24/49; H01L 2224/05554; H01L 2224/48108; H01L 2224/48245; H01L 2224/48247; H01L 2224/49171; H01L 2224/85205; H01L 2224/85206; H01L 2924/00014; H01L 2924/00; H01L 2924/181; H01L 2924/00011; H01R 4/029; H01R 4/60; H01R 4/643; H01R 43/0207; H01R 43/0221; H01R 43/0256; H01R 43/04; H01R 43/16

See application file for complete search history.

(56) References Cited

U.S. PATENT DOCUMENTS

| | | | |
|---|---|---|---|
| 9,466,892 B2 | 10/2016 | Iio et al. | |
| 9,661,775 B2* | 5/2017 | Schillinger | ......... H01L 23/3107 |
| 10,032,743 B2* | 7/2018 | Bayerer | ................. H01L 24/85 |
| 2006/0032667 A1 | 2/2006 | Sato | |
| 2008/0013298 A1* | 1/2008 | Sharma | ................ G01D 11/245 361/813 |
| 2014/0370663 A1* | 12/2014 | Bayerer | ............ H01L 23/49861 438/125 |
| 2015/0189783 A1* | 7/2015 | Schillinger | ......... H01L 23/3107 361/679.01 |

FOREIGN PATENT DOCUMENTS

| | | | | |
|---|---|---|---|---|
| DE | 102012213 353 | * | 8/2013 | ............... H05K 7/02 |
| DE | 102014213588 A1 | | 2/2016 | |
| EP | 1063737 A2 | | 12/2000 | |
| EP | 1841299 A2 | | 10/2007 | |
| WO | 2008128845 A1 | | 10/2008 | |
| WO | WO-2014020034 A1 | * | 2/2014 | ......... H01L 23/3107 |

OTHER PUBLICATIONS

Chinese Office Action for Chinese Application No. 201680069440.X, dated Feb. 28, 2019, 7 pages.
International Search Report and Written Opinion for International Application No. PCT/EP2016/073162, dated Jan. 17, 2017, 8 pages.
German Search Report for Application No. 10 2015 224 257.9, dated Nov. 11, 2016 with partial translation, 9 pages.

* cited by examiner

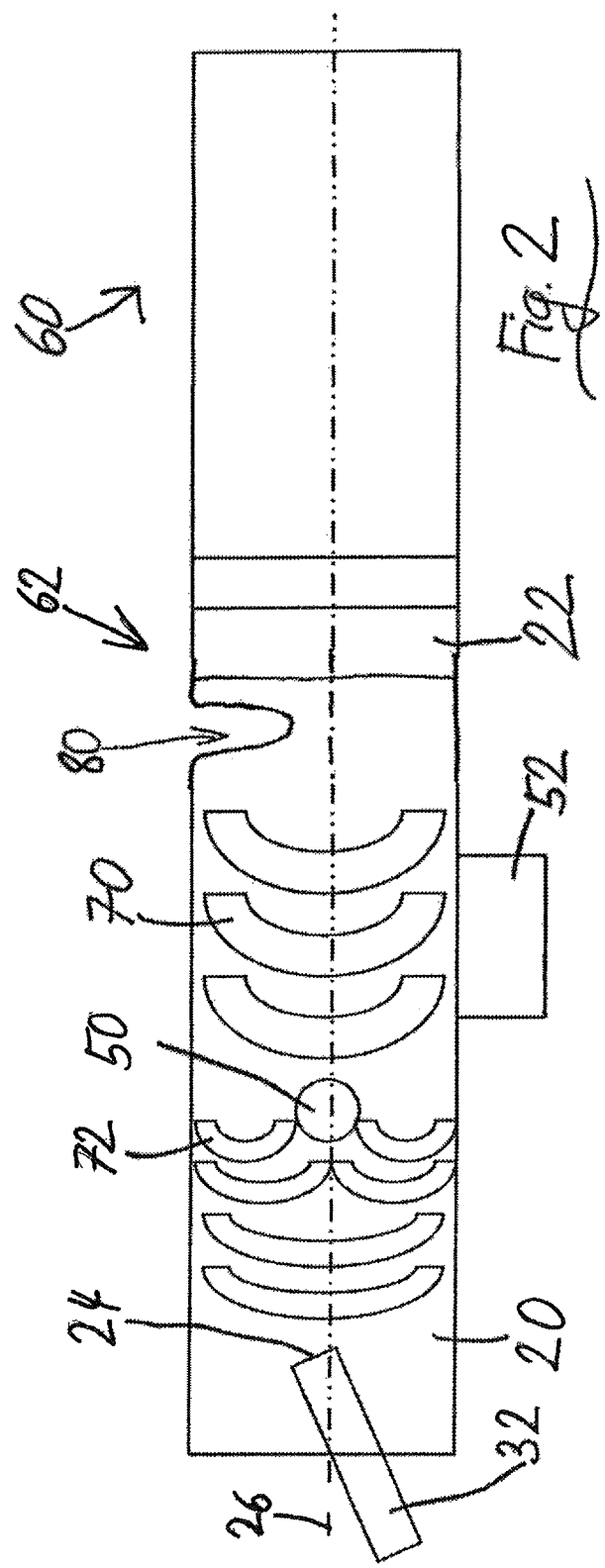

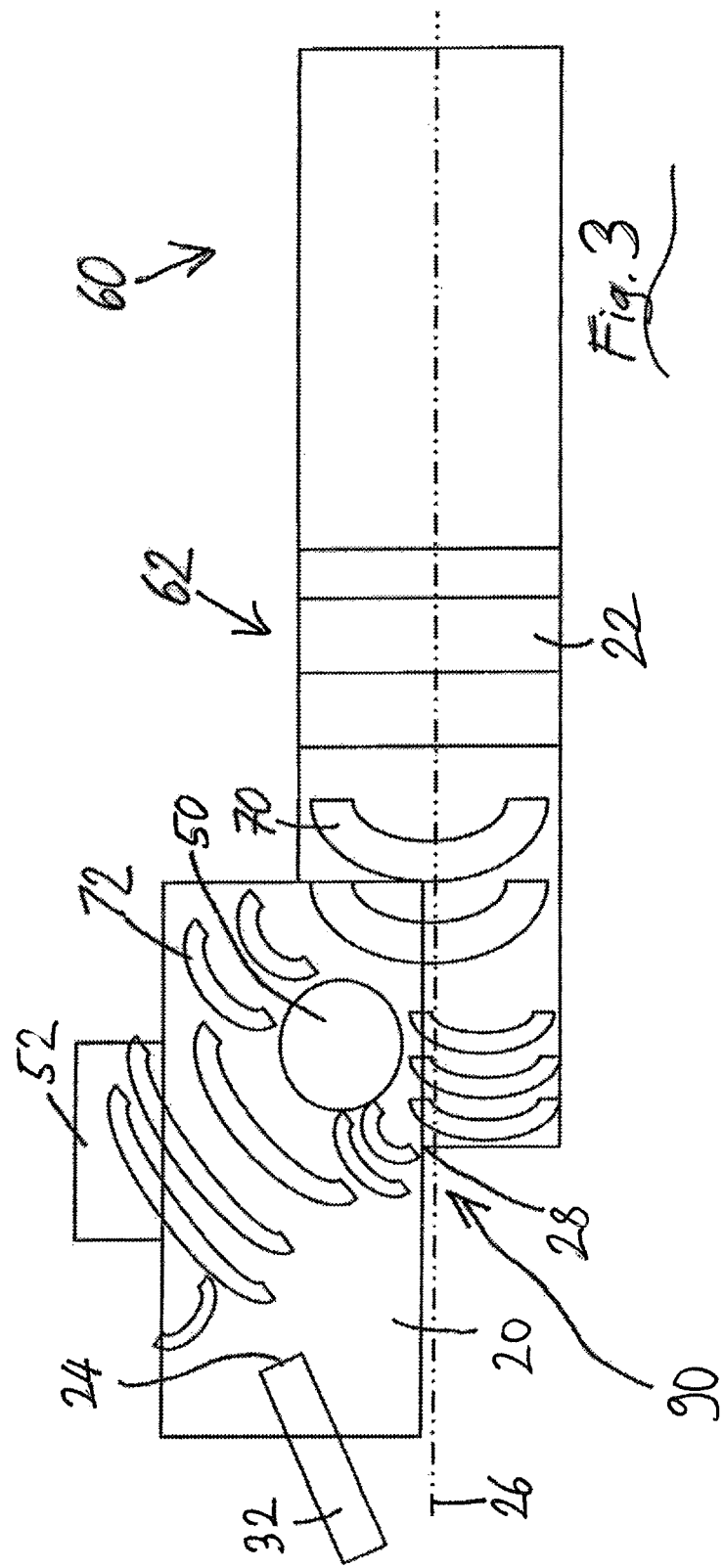

ELECTRIC CONDUCTOR TRACK, METHOD, AND USE

CROSS REFERENCE TO RELATED APPLICATIONS

This application is the U.S. National Phase Application of PCT International Application No. PCT/EP2016/073162, filed Sep. 29, 2016, which claims priority to German Patent Application No. 10 2015 224 257.9, filed Dec. 3, 2015, the contents of such applications being incorporated by reference herein.

FIELD OF THE INVENTION

The invention relates to an electrical conductor track, a method for connecting an electrical conductor track to an electrical contact and the use of ultrasonic welding to connect an electrical contact to an electrical conductor track.

BACKGROUND OF THE INVENTION

Electrical conductor tracks are used, for example, on electrical or electronic components in order to conduct electric current in a defined manner. Said electrical conductor tracks are often connected to one or more electrical contacts for the purpose of contact-connection.

To connect contacts to conductor tracks, it is not typically possible to use ultrasonic welding, particularly with small dimensions. This is owing to the fact, in particular, that otherwise there is the risk that bonding wires that have already been bonded on will detach again due to the effect of the ultrasound. Accordingly, in methods or embodiments according to the prior art, it is conventional to use alternative joining methods, for example resistance welding, crimping, splicing or soldering.

However, as a result thereof, the process and material costs are significantly increased on account of the use of auxiliary substances or special contact formations.

SUMMARY OF THE INVENTION

It is therefore an aspect of the invention to provide an electrical conductor track in which the use of ultrasonic welding is possible. Furthermore, there are aspects of the invention to provide an associated method and the associated use.

An aspect of the invention relates to an electrical conductor track.

The electrical conductor track has a contact location, which is designed to be connected to an electrical contact by means of ultrasonic welding. This makes it possible to connect the conductor track to an electrical contact.

The electrical conductor track has a bonding location, which is designed to bond a bonding wire onto the conductor track. In particular, an integrated circuit (IC) or a similar or different component, for example a sensor, can be connected thereto.

The electrical conductor track also has at least one ultrasonic wave interruption element, which, when ultrasound is coupled in at the contact location, attenuates a propagation of ultrasonic waves from the contact location to the bonding location.

By means of the conductor track according to an aspect of the invention, it is possible to use ultrasonic welding to connect a conductor track to an electrical contact. The ultrasonic wave interruption element is typically designed here to ensure that only fewer ultrasonic waves arrive at the bonding location or the ultrasonic waves arrive with only a lower intensity than without the ultrasonic wave interruption element. The bonding wire is thereby particularly advantageously protected against being removed by the effect of the ultrasound.

According to one embodiment, the ultrasonic wave interruption element is a hole, in particular an anchor hole. An anchor hole of this kind can, in particular, break and/or divert ultrasonic waves. This can be calculated, for example, using conventional methods of wave dynamics.

The hole can be arranged, in particular, on a connecting line between the bonding location and the contact location. The ultrasound can thus typically be diverted away from the bonding location in a particularly advantageous manner and the ultrasonic waves can be prevented from reaching the bonding location, at least at an excessive intensity.

According to one embodiment, the ultrasonic wave interruption element is designed as a notch. An advantageous breaking or diversion of ultrasonic waves can thus be achieved, such that said ultrasonic waves can be kept away, in particular, from the bonding location or the intensity of the ultrasonic waves at the bonding location can be reduced.

According to one embodiment, the ultrasonic wave interruption element is designed as an angled portion. Ultrasonic waves can also advantageously be broken or diverted thereby such that the intensity thereof at the bonding location can be significantly reduced.

According to one embodiment, the ultrasonic wave interruption element is designed as an offset portion. The intensity of ultrasonic waves at the bonding location can also be reduced thereby.

According to one development, the electrical conductor track can have a plurality of ultrasonic wave interruption elements, which, when ultrasound is used at the contact location, each attenuate a propagation of ultrasonic waves from the contact location to the bonding location. Here, in particular, the described embodiments can be combined in any desired manner. By employing a plurality of ultrasonic wave interruption elements, a plurality of bonding locations can be protected, for example. Furthermore, a respective bonding location can be protected in a particularly advantageous manner when the effects of a plurality of ultrasonic wave interruption elements are combined.

The electrical conductor track can be, in particular, part of a chip package, which contains, in particular, a sensor. However, other electrical or electronic components may also be contained, such as an integrated circuit (IC), a capacitor, a resistor, an inductance, a transistor or a diode, for example. In particular, said components can be bonded, wherein they can be connected, in particular, to one or more bonding locations of the electrical conductor track. A plurality of electrical conductor tracks according to an aspect of the invention can also be present in a chip package of this kind. A combination of electrical conductor tracks according to an aspect of the invention and electrical conductor tracks not according to an aspect of the invention is also possible.

In particular, the chip package can be housed. For example, said chip package can be housed by one or more molded bodies.

The electrical conductor track can be, in particular, part of a leadframe. This makes particularly advantageous and automated production possible.

An aspect of the invention further relates to a method for connecting an electrical conductor track to an electrical contact, which has the following steps:

providing an electrical conductor track according to an aspect of the invention, applying an electrical contact to the contact location, and coupling ultrasound in at the contact location for the purpose of connecting the electrical contact to the electrical conductor track.

The method according to an aspect of the invention makes it possible to connect an electrical conductor track to an electrical contact in a particularly advantageous manner. In respect of the electrical conductor track according to an aspect of the invention, reference can be made back to all of the described embodiments and variants.

In particular, when using the method according to an aspect of the invention, it is possible to prevent damage to the bonding location or bonding connection due to ultrasound. This expedient and reliable method can thus be used to connect an electrical conductor track to an electrical contact, even when a bonding wire has already been bonded onto the printed circuit board and the bonding location is close to the location at which the electrical contact is intended to be connected. Large structures for preventing damage to the bonding location can be omitted.

The contact can be, in particular, a cable, a Litz wire or a plug contact. Contacts of this kind are often connected to electrical conductor tracks.

An aspect of the invention further relates to a method for connecting an electrical conductor track to an electrical contact, which has the following steps:

providing an electrical conductor track, on which a contact location and a bonding location are formed, applying an electrical contact to the contact location of the electrical conductor track, and coupling ultrasound in at the contact location for the purpose of connecting the electrical contact to the electrical conductor track, wherein a propagation of ultrasonic waves to the bonding location is reduced by a number of ultrasonic wave interruption elements formed in the conductor track.

The advantages described further above can also be achieved by means of this method.

The electrical conductor track can be designed, in particular, according to an aspect of the invention. In this case, it is possible to resort to all the embodiments and variants described.

In particular, a bonding wire can be bonded at the bonding location of the electrical conductor track. This allows an advantageous connection of components, such as sensors or integrated circuits, for example.

Advantageously, a central line of the ultrasound in-coupling does not run through the bonding contact.

An aspect of the invention furthermore relates to the use of ultrasonic welding to connect an electrical contact to an electrical conductor track, wherein a propagation of ultrasonic waves to a bonding location of the conductor track is reduced by at least one ultrasound wave interruption element.

In this case, it may be, in particular, an electrical conductor track according to an aspect of the invention that is involved, wherein it is possible to refer back to all the embodiments and variants described. The use can also be implemented, in particular, by means of a method according to an aspect of the invention. In this case, too, it is possible to refer back to all the embodiments and variants described.

BRIEF DESCRIPTION OF THE DRAWINGS

Further features and advantages will be gathered by a person skilled in the art from the exemplary embodiments described below with reference to the appended drawing. In the drawing:

FIG. 2: shows an electrical conductor track of the chip package of FIG. 1 with the propagation of ultrasonic waves illustrated, FIG. 3: shows an alternative electrical conductor track.

DETAILED DESCRIPTION OF THE PREFERRED EMBODIMENTS

Figure 1:
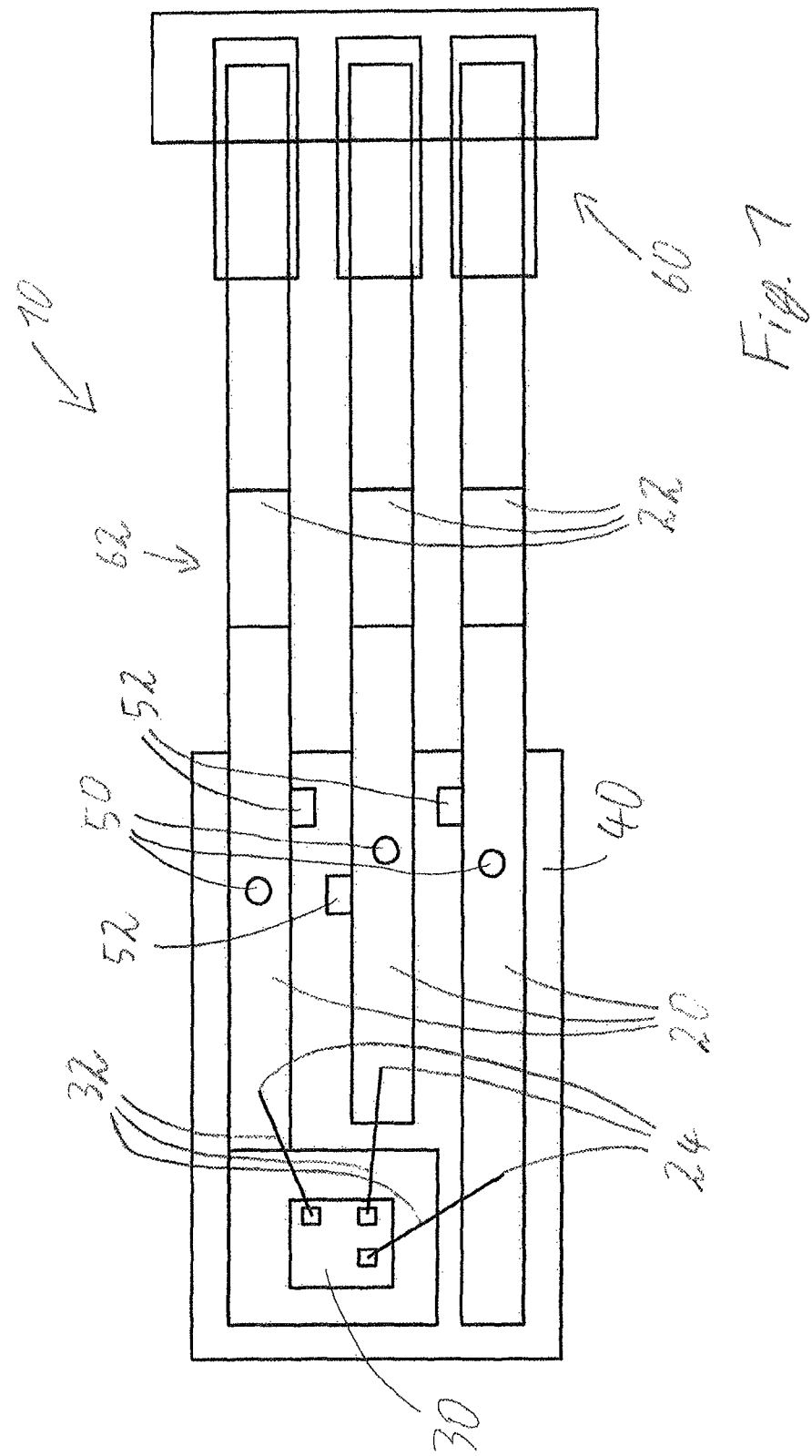
FIG. 1: shows a chip package.

FIG. 1 shows a chip package 10 having electrical conductor tracks 20 according to an aspect of the invention, which chip package has been connected to an electrical contact in the form of a plug 60 by means of a method according to an aspect of the invention.

The chip package 10 has a total of three electrical conductor tracks 20. The chip package further has a sensor 30, which constitutes a component, which is to be contact-connected by means of the electrical conductor tracks 20.

The sensor 30 and a portion of the electrical conductor tracks 20 are enclosed by a molded housing 40. This constitutes electrical and mechanical protection.

The electrical conductor tracks 20 are mounted on a leadframe for production, which, in particular, makes mass production significantly easier.

Each electrical conductor track 20 has a contact location 22. Said contact location is designed to be connected to the plug 60 by means of ultrasonic welding.

Each electrical conductor track 20 further has a bonding location 24, which is designed to bond a respective bonding wire.

The sensor 30 is connected to each of the electrical conductor tracks 20 by means of a respective bonding wire 32. The bonding wires 32 are each applied here to the bonding location 24 of a respective electrical conductor track 20.

Each electrical conductor track 20 has a respective anchor hole 50, which is located in the housing 40 and ensures better support of the respective electrical conductor track 20 in the housing 40. Each electrical conductor track 20 likewise has a respective lateral anchor 52, which likewise ensures anchoring in the housing 40. In particular, the anchor holes 50 also serve to protect the bonding locations 24 from ultrasound, as will be described in more detail further below.

The plug 60 is connected to the electrical conductor tracks 20 at a connecting zone 62. A method according to an aspect of the invention employing ultrasound is used for this purpose. This will be described in more detail below with reference to FIG. 2.

FIG. 2 shows an electrical conductor track 20 with a portion of the plug 60. Said portion of the plug is connected to the electrical conductor track 20 by means of a method according to an aspect of the invention. To this end, the plug 60 is brought into connection with the conductor track 20 at the contact location 22 of the conductor track 20. This produces the connecting zone 62.

Ultrasound is coupled in at the connecting zone 62 by means of a sonotrode. This ensures a secure connection between the electrical conductor track 20 and the plug 60 by means of ultrasonic welding.

During the ultrasonic welding process, ultrasonic waves 70 propagate in the electrical conductor track 20 along a central line 26 of the electrical conductor track 20. If said ultrasonic waves were to impinge on the bonding location 24 after a short distance without further measures, this would damage the connection between the bonding wire 32 and the bonding location 24, which would lead to a failure of the entire system.

However, the anchor hole 50 acts in the electrical conductor track as an ultrasonic wave interruption element. In this case, the ultrasonic waves 70 propagating before the anchor hole 50 are broken and divided into separate ultrasonic waves 72. This achieves a situation in which the intensity of the ultrasonic waves at the bonding location 24 is significantly lower than without the appropriately placed anchor hole 50.

As shown, both the anchor hole 50 and the bonding location 24 are located on the central line 26. This leads to a situation in which the ultrasonic waves 70, 72 are guided away from the bonding location 24 in a particularly effective manner, such that the protective effect just described comes into play in a particularly advantageous manner.

However, it should nevertheless be pointed out that this does not constitute the only possible embodiment.

The anchor hole 50 acts, in particular, as a gap in the wave propagation. The ultrasound is broken, as a result of which the amplitude at which the ultrasound impinges on and damages the bonding location 24 is reduced. The ultrasonic wave interruption element may also be embodied as a notch 80, as shown in FIG. 2.

FIG. 3 shows an electrical conductor track 20 according to a further exemplary embodiment of an aspect of the invention. In this case, an angled portion 28 is designed as an additional ultrasonic wave interruption element. This angled portion 28 also leads to a situation in which the propagation of the ultrasonic waves 70, 72 is guided away from the bonding location 24. The ultrasonic waves 70, 72 are in this case partly guided into the anchor 52.

Other than that, with respect to FIG. 3, reference is made to the above statements.

FIG. 3 shows, in particular, how changing the leadframe design or the electrical conductor track 20 can divert the ultrasound in such a way that the amplitude is reduced by the design without larger paths being required.

The new or inventive design contains, for example, one or more of the following features:
  The central line of the ultrasound in-coupling does not run through the bonding contact
  The lead or the electrical conductor track has an offset portion (e.g. offset portion 90, as shown in FIG. 3), such that the lead widths before and after the offset portion can be different.
  The lead width and the diameter of the anchor hole are coordinated with one another by taking account of the ultrasonic frequency and the in-coupling thereof.
  The position of the anchor hole is used to break the ultrasonic waves and to divert them into the anchors.
  The position and shape of the anchor and/or anchor hole is selected in such a way that the ultrasound "loses momentum".

Only a weak ultrasonic interference field arises at the bonding location. Additional damping is typically not necessary.

Mentioned steps of the method according to an aspect of the invention can be executed in the indicated order. However, they can also be executed in a different order. In one of its embodiments, for example with a specific combination of steps, the method according to an aspect of the invention can be executed in such a way that no further steps are executed. However, in principle, further steps can also be executed, even steps of a kind which have not been mentioned.

The claims that are part of the application do not represent any dispensing with the attainment of further protection.

If it turns out in the course of proceedings that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Claims or combinations of features of this kind requiring rewording can be understood to be covered by the disclosure of this application as well.

It should further be pointed out that configurations, features and variants of an aspect of the invention that are described in the various embodiments or exemplary embodiments and/or shown in the figures are combinable with one another in any way. Single or multiple features can be interchanged with one another in any way. Combinations of features arising therefrom can be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to an aspect of the invention. They can therefore also be individually included in claims for the purpose of distinction from the prior art.

The invention claimed is:

1. An electrical conductor track formed from a continuous section of material, comprising: a contact location provided on the continuous section of material, which is designed to be connected to an electrical contact by ultrasonic welding, a bonding location provided on the continuous section of material, which is designed to bond a bonding wire onto the conductor track, and at least one ultrasonic wave interruption element, which, when ultrasound is coupled in at the contact location, attenuates a propagation of ultrasonic waves along the continuous section of material from the contact location to the bonding location, the at least one ultrasonic wave interruption element comprising a hole through the continuous section of material, the hole surrounded on all sides by the continuous section of material.

2. The electrical conductor track as claimed in claim 1, wherein the hole is arranged on a connecting line between the bonding location and the contact location.

3. The electrical conductor track as claimed in claim 1, further comprising:
  a plurality of ultrasonic wave interruption elements, which, when ultrasound is used at the contact location, each attenuate a propagation of ultrasonic waves from the contact location to the bonding location.

4. The electrical conductor track as claimed in claim 1, wherein the electrical conductor track is part of a chip package, which contains a sensor.

5. The electrical conductor track as claimed in claim 1, which is part of a leadframe.

6. An electrical conductor track formed from a continuous section of material, comprising:
  a contact location provided on the continuous section of material, which is designed to be connected to an electrical contact by ultrasonic welding, a bonding location provided on the continuous section of material, which is designed to bond a bonding wire onto the conductor track, and at least one ultrasonic wave interruption element, which, when ultrasound is coupled in at the contact location, attenuates a propagation of ultrasonic waves along the continuous section of material from the contact location to the bonding location, wherein the ultrasonic wave interruption element is a notch.

7. An electrical conductor track formed from a continuous section of material, comprising:

a contact location provided on the continuous section of material, which is designed to be connected to an electrical contact by ultrasonic welding, a bonding location provided on the continuous section of material, which is designed to bond a bonding wire onto the conductor track, and at least one ultrasonic wave interruption element, which, when ultrasound is coupled in at the contact location, attenuates a propagation of ultrasonic waves along the continuous section of material from the contact location to the bonding location, wherein the ultrasonic wave interruption element is an angled portion.

8. An electrical conductor track formed from a continuous section of material, comprising:

a contact location provided on the continuous section of material, which is designed to be connected to an electrical contact by ultrasonic welding, a bonding location provided on the continuous section of material, which is designed to bond a bonding wire onto the conductor track, and at least one ultrasonic wave interruption element, which, when ultrasound is coupled in at the contact location, attenuates a propagation of ultrasonic waves along the continuous section of material from the contact location to the bonding location, wherein the ultrasonic wave interruption element is an offset portion.

9. A method for connecting an electrical conductor track to an electrical contact, the electrical contract tract comprising: a contact location, a bonding location, and at least one ultrasonic wave interruption element, the method comprising:

providing the electrical conductor track, applying the electrical contact to the contact location, and coupling ultrasound in at the contact location to connect the electrical contact to the electrical conductor track, wherein, when the ultrasound is coupled in at the contact location, the ultrasonic wave interruption element attenuates propagation of ultrasonic waves from the contact location to the bonding location.

10. The method as claimed in claim 9, wherein a central line of the ultrasound in-coupling does not run through the bonding location.

11. The method as claimed in claim 9, wherein a bonding wire is bonded at the bonding location of the electrical conductor track.

12. The method as claimed in claim 11, wherein a central line of the ultrasound in-coupling does not run through the bonding location.

13. A method of ultrasonic welding an electrical contact to an electrical conductor track, comprising propagating ultrasonic waves to a bonding location of the conductor track and reducing the ultrasonic waves by at least one ultrasound wave interruption element.

* * * * *